(12) United States Patent
Wu

(10) Patent No.: US 8,524,541 B2
(45) Date of Patent: Sep. 3, 2013

(54) PROCESSES FOR MANUFACTURING AN LED PACKAGE WITH TOP AND BOTTOM ELECTRODES

(75) Inventor: Jiahn-Chang Wu, Chutung (TW)

(73) Assignee: Cheng Kung Capital, LLC, Wilmington, DE (US)

( * ) Notice: Subject to any disclaimer, the term of this patent is extended or adjusted under 35 U.S.C. 154(b) by 0 days.

(21) Appl. No.: 13/548,067

(22) Filed: Jul. 12, 2012

(65) Prior Publication Data
US 2012/0273835 A1  Nov. 1, 2012

Related U.S. Application Data

(62) Division of application No. 12/554,189, filed on Sep. 4, 2009, now Pat. No. 8,247,835.

(30) Foreign Application Priority Data

Jul. 16, 2009 (TW) ................................ 98124031 A

(51) Int. Cl.
*H01L 29/24* (2006.01)
(52) U.S. Cl.
USPC ................ 438/124; 438/26; 438/51; 438/55; 438/64; 438/106; 438/111; 438/123

(58) Field of Classification Search
USPC ................ 438/26, 51, 55, 64, 106, 123, 124, 438/FOR. 380
See application file for complete search history.

(56) References Cited

U.S. PATENT DOCUMENTS

| 6,433,418 B1* | 8/2002 | Fujisawa et al. ............ 257/696 |
| 7,445,355 B2 | 11/2008 | Wu |
| 2002/0140079 A1 | 10/2002 | Takeyama |
| 2005/0280158 A1 | 12/2005 | Crane, Jr. |
| 2008/0073762 A1 | 3/2008 | Han |

FOREIGN PATENT DOCUMENTS

TW  097216261  9/1997

* cited by examiner

*Primary Examiner* — Thanh V Pham
(74) *Attorney, Agent, or Firm* — Christensen O'Connor Johnson Kindness PLLC

(57) ABSTRACT

An LED package with an extended top electrode and an extended bottom electrode is made from a single metal sheet, one manufacturing process embodiment includes: preparing a piece of single metal sheet, forming a first metal and a coplanar second metal, mounting an LED on an inner end of the first metal, wire-bonding top electrode to an inner end of the second metal, encapsulating at least the LED and the bonding wire with a protection glue, bending an outer end of the first metal upward twice 90 degrees to form a top flat as an extended top electrode of the package, and bending an outer end of the second metal downward twice 90 degrees to form a bottom flat as an extended bottom electrode of the package.

7 Claims, 7 Drawing Sheets

(A)

(B)

PROCESSES FOR MANUFACTURING AN LED PACKAGE WITH TOP AND BOTTOM ELECTRODES

CROSS-REFERENCES TO RELATED APPLICATIONS

The present application is a division of patent application Ser. No. 12/554,189, filed Sep. 4, 2009, which claims priority from the Taiwanese Patent Application No. 098124031, filed Jul. 16, 2009, the disclosures of said applications are incorporated by reference herein in their entirety.

BACKGROUND

FIG. 1 is an LED cassette unit 200 which is disclosed in U.S. Pat. No. 7,445,355. The LED cassette unit 200 has a top metal electrode 21 and a bottom metal electrode 22. An insulation layer 25 is sandwiched in between the top metal electrode 21 and the bottom metal electrode 22. A center void is made in a center of the top metal electrode 21 and the insulation layer 25 to expose a center surface of the bottom metal electrode 22. An LED 20 is mounted on the bottom metal electrode 22 in the center void. A metal wire 24 electrically couples a top electrode of the LED 20 to the top metal electrode 21. A bottom electrode of the LED 20 electrically contacts the bottom metal electrode 22. Protection glue 23 encapsulates the metal wire 24 and the LED 20 for ensuring the quality and reliability of the LED package.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In accordance with aspects of the present disclosure, a manufacturing process is provided for making an LED package. The manufacturing process includes: mounting an LED on an inner end of a first metal, wherein the LED is electrically coupled to the first metal; electrically coupling the LED to an inner end of a second metal by a metal wire; bending an outer end of the first metal in a first direction to form a top electrode of the LED package; bending an outer end of the second metal in a second direction opposite of the first direction to form a bottom electrode of the LED package; and enclosing the LED and the metal wire in a protection molding.

In accordance with another aspect of the present disclosure, an LED package is provided. The LED package includes a first I metal having a beam, a pair of c-shaped metals, and a pair of inverse c-shaped metals. The LED package also includes a second metal having an inverse c shape with a top flat and a bottom flat, wherein the bottom flat of the second metal forms a bottom electrode of the LED package, an LED mounted on and electrically coupled to one of the beam of the first I metal or the top flat of the second metal, wherein the LED is electrically coupled by a metal wire to the other of the beam of the first I metal or the top flat of the second metal, and a protection molding enclosing the LED and the wire.

In some embodiments of the LED package, each of the c-shaped metals has a top flat and a bottom flat, wherein the bottom flats of the c-shaped metals extend from a first side of the beam and the top flats of the c-shaped metals form top electrodes of the LED package. In these embodiments and/or other embodiments of the LED package, each of the inverse c-shaped metals has a top flat and a bottom flat, wherein the bottom flats of the inverse c-shaped metals extend from a second side of the beam and the top flats of the inverse c-shaped metals forming top electrodes of the LED package.

In accordance with another aspect of the present disclosure, a manufacturing process is provided for making an LED package. The manufacturing process includes: mounting an LED on a beam of an I metal such that the LED is electrically coupled to the beam, wherein the I metal has a pair of c-shaped metals and a pair of inverse c-shaped metals; electrically coupling the LED to a second metal by a metal wire, wherein the second metal has an inverse c shape with a top flat and a bottom flat, and wherein the bottom flat of the second metal forms a bottom electrode of the LED package, and enclosing the LED and the metal wire in a protection molding.

In some embodiments of the manufacturing process, each of the c-shaped metals has a top flat and a bottom flat, wherein the top flats of the c-shaped metals form top electrodes of the LED package and the bottom flats of the c-shaped metals extend from a first side of the beam. In these and/or other embodiments of the manufacturing process, each of the inverse c-shaped metals has a top flat and a bottom flat, wherein the top flats of the inverse c-shaped metals form top electrodes of the LED package and the bottom flats of the inverse c-shaped metals extend from a second side of the beam.

In accordance with yet another aspect of the present disclosure, a manufacturing process is provided for making an LED package. The manufacturing process includes preparing a c-shaped metal by bending a first metal upwards twice 90 degrees, wherein the c-shaped metal has a top flat and a bottom flat, and wherein the top flat forms a top electrode of the LED package. The manufacturing process also includes preparing an inverse c-shaped metal by bending a second metal downwards twice 90 degrees, wherein the inverse c-shaped metal has a top flat and a bottom flat, and wherein the bottom flat forms a bottom electrode of the LED package. The manufacturing process further includes electrically coupling an LED to the bottom flat of the c-shaped metal and to the top flat of the inverse c-shaped metal, and enclosing the LED in a protection molding.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

Figure 1:
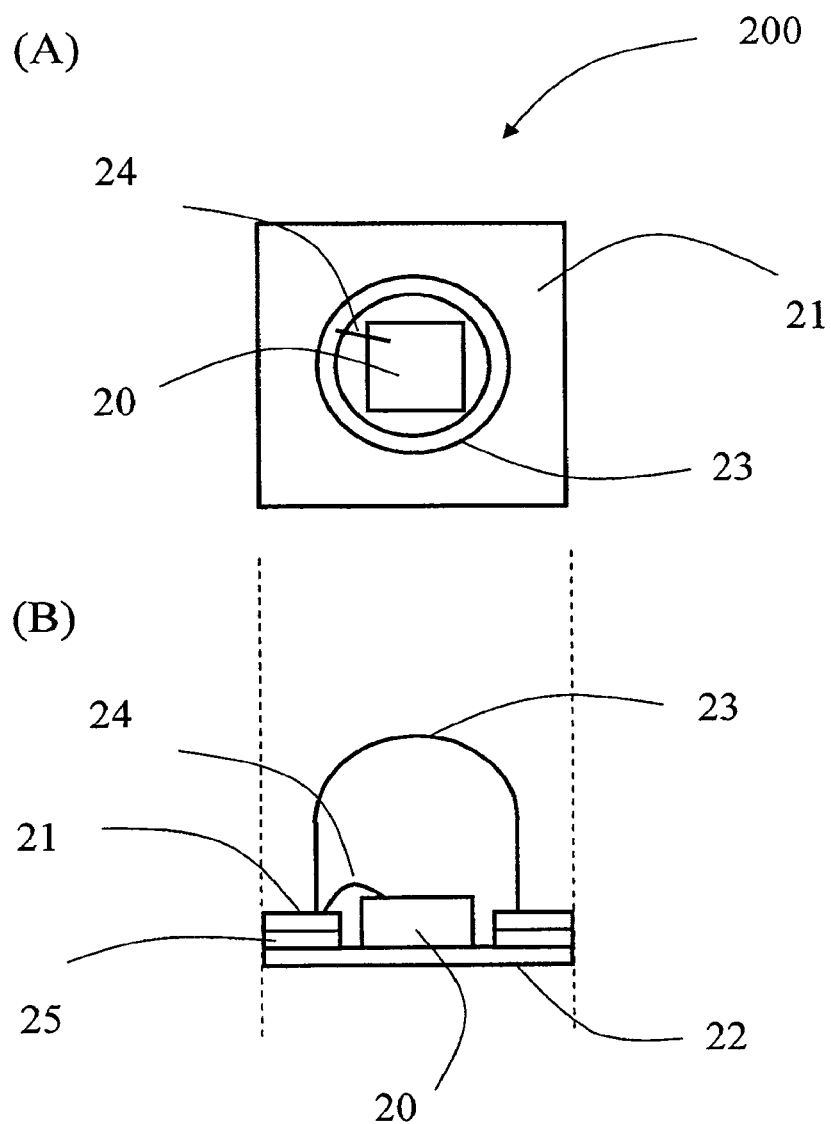
FIG. 1 shows an LED cassette unit.

An improved manufacturing process to manufacture an LED package with a top electrode and a bottom electrode is disclosed. The process includes preparing a piece of metal sheet, forming a pair of coplanar metals, namely, a first metal and a second metal, mounting an LED chip on an inner end of the first metal, wire-bonding a top electrode of the LED chip to an inner end of the second metal, molding to protect at least the LED chip and the bonding wire, bending an outer end of the first metal upward to form an extended flat top electrode, and bending an outer end of the second metal downward to form an extended bottom flat electrode.

FIGS. 2A, 2B, 3A, and 3B show different views of a first embodiment according to the present disclosure.

FIG. 2A shows a first embodiment before bending the metals according to the present disclosure. The process includes: (1) preparing a single piece of metal sheet (not shown), (2) forming a first metal 511 and a coplanar second metal 512 by, for example, punching the single piece of metal sheet, (3) mounting an LED 50 on an inner end of the first metal 511 and electrically coupling a bottom electrode of the LED 50 to the first metal 511, (4) electrically coupling a top electrode of the LED 50 to an inner end of the second metal 512 through wire-bonding with a metal wire 52, and (5) protection molding with glue 53 for fixing and protecting at least the LED 50, the wire 52, and the inner ends of the two metals 511, 512.

FIG. 2B shows a side view of FIG. 2A. An outer end of the first metal 511 exposed outside of the glue 53 is going to be bent upward, and an outer end of the second metal 512 is exposed outside of the glue 53 going to be bent downward.

FIG. 3A shows a top view after bending of the metals 511, 512 according to the present disclosure. The outer end of the first metal 511 is bent upward twice 90 degrees to form a top flat 511T as a first extended electrode. The outer end of the second metal 512 is bent downward twice 90 degrees to form a bottom flat 512B as a second extended electrode.

FIG. 3B shows a side view of FIG. 3A. The outer end of the first metal 511 is bent to form a c-shaped top flat 511T as a top electrode of the package. The outer end of the second metal 512 is bent to form an inverse c-shaped bottom flat 512B as a bottom electrode of the package.

FIGS. 4A, 4B, 5A, 5B, and 6A-6D show different views of a second embodiment according to the present disclosure.

Figure 4:
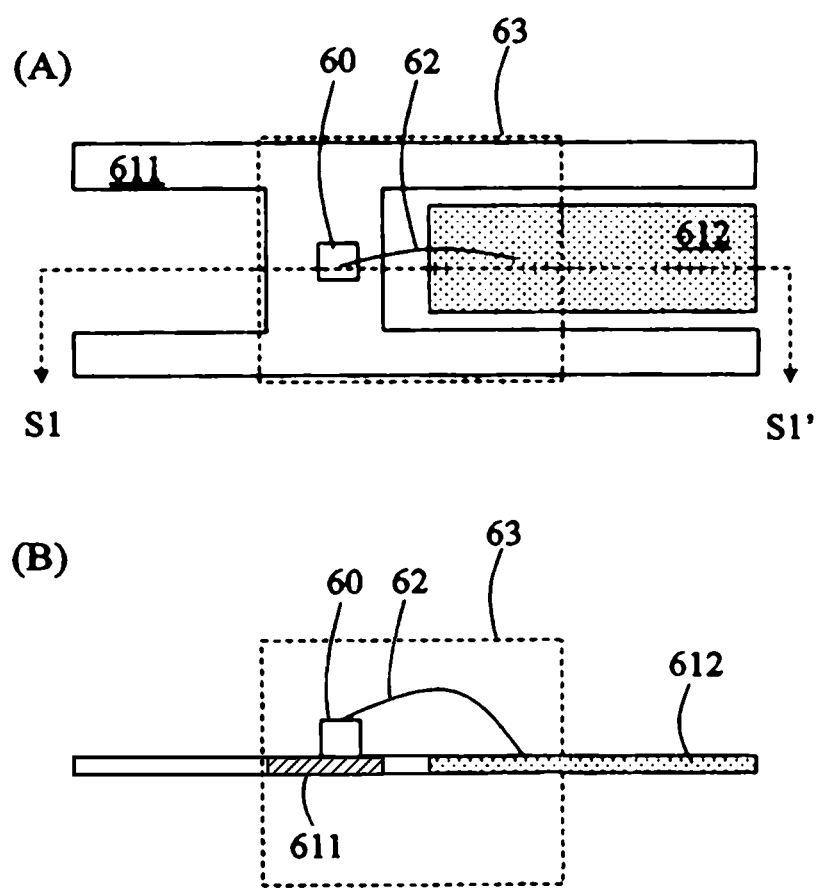
FIGS. 4A, 4B, 5A, 5B, and 6A-6D show different views of a second embodiment according to the present disclosure.

FIG. 4A shows a second embodiment before bending the metals according to the present disclosure. The process includes: (1) preparing a single metal sheet (not shown), (2) forming an I metal 611 (first metal) and a coplanar rectangular metal 612 (second metal); the I metal 611 has a vertical beam, a first pair of horizontal legs extended from a first side of the vertical beam, and a second pair of horizontal legs extended from a second side of the vertical beam; the rectangular metal 612 is located in between one of the two pairs of horizontal legs, (3) mounting an LED 60 on the vertical beam of the I metal 611, electrically coupling a bottom electrode of the LED 60 to the I metal 611 through direct contact, (4) electrically coupling a top electrode of the LED 60 to an inner end of the rectangular metal 612 through wire-bonding with a metal wire 62, and (5) protection molding with glue 63 for fixing and protecting at least the LED 60, the metal wire 62, and the inner end of the rectangular metal 612.

FIG. 4B shows a side view of FIG. 4A. Outer ends of the four horizontal legs of the I metal 611 are exposed outside of the glue 63, with each of the four horizontal legs to be bent upward, and an outer end of the rectangular metal 612 exposed outside of the glue 63 to be bent downward.

Figure 5A:
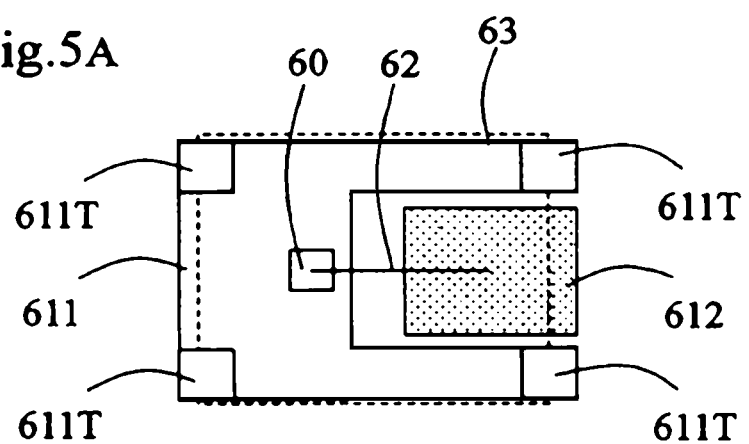

FIG. 5A shows a top view after bending the horizontal legs of the I metal 611 and the rectangular metal 612 according to the present disclosure. Each of the outer ends of the four horizontal legs of the I metal 611 is bent upward twice 90 degrees to form four top flats 611T as extended top electrodes of the LED package. The outer end of the rectangular metal 612 is bent downward twice 90 degrees to form a bottom flat 612B as an extended bottom electrode of the LED package.

Figure 5B:
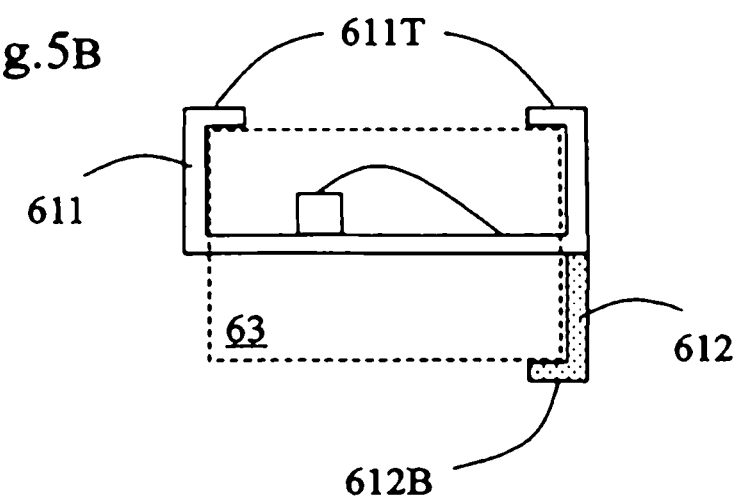

FIG. 5B shows a side view of FIG. 5A. The first pair of horizontal legs from the first side of the I metal 611 are bent to form a pair of c-shaped metals with two top flats 611T, a first top electrode and a second top electrode of the package. The second pair of horizontal legs from the second side of the I metal 611 are bent to form a pair of inverse c-shaped metal with two top flats 611T as a third top electrode and a fourth top electrode of the package. The rectangular metal 612 is bent to form an inverse c-shaped metal with the bottom flat 612B as a bottom electrode of the LED package.

Figure 6A:
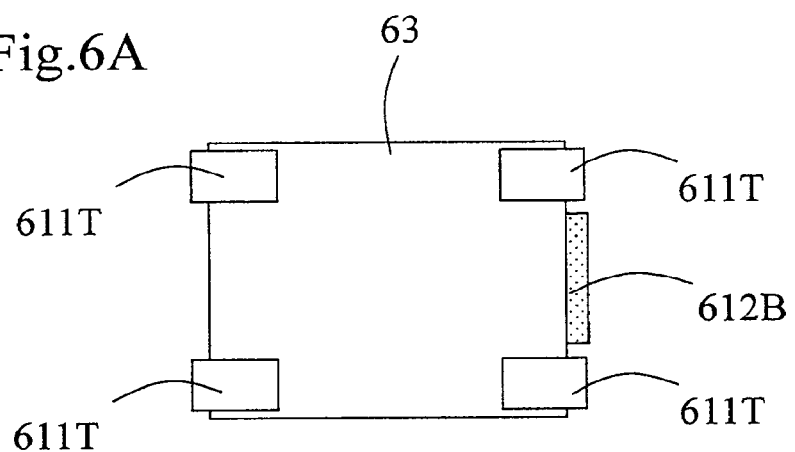

FIG. 6A shows a top view of the LED package shown in FIG. 5A or 5B. Four top flats 611T are shown which function as extended top electrodes of the LED package.

Figure 6B:
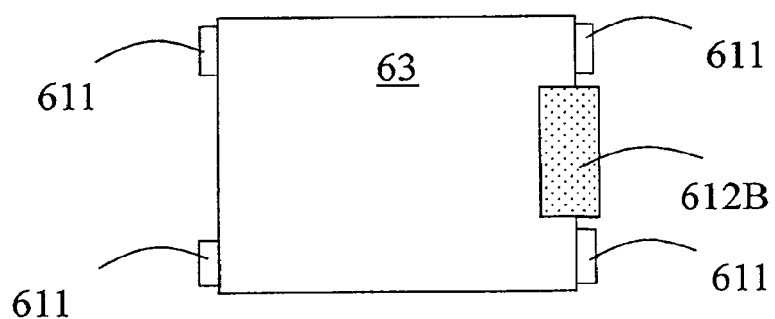

FIG. 6B shows a bottom view of the LED package shown in FIG. 5A or 5B. The bottom flat 612B is shown which functions as a bottom electrode of the LED package.

Figure 6C:
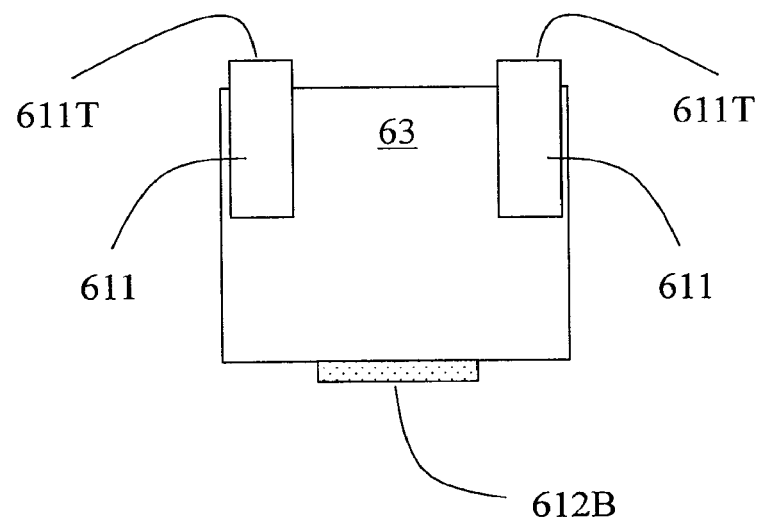

FIG. 6C shows a first side view of the LED package shown in FIG. 5A or 5B. The first pair of horizontal legs from the first side of the I metal 611 and the two top flats 611T are shown on the first side of the LED package.

Figure 6D:
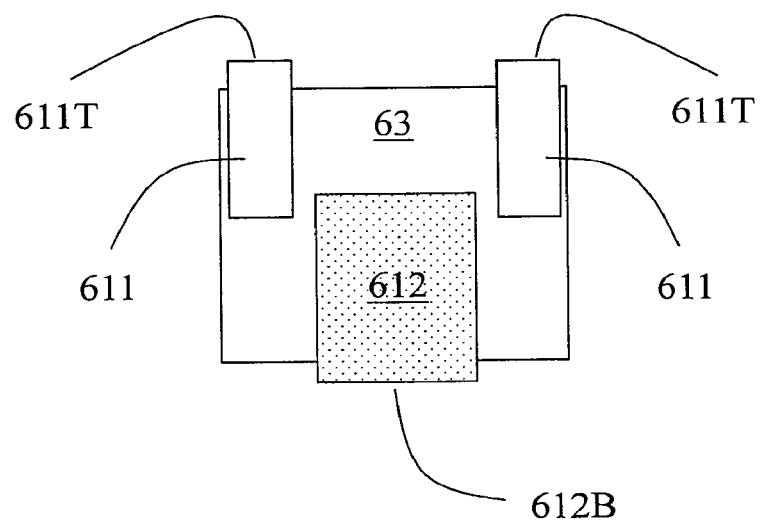

FIG. 6D shows a second side view of the LED package shown in FIG. 5A or 5B. The second pair of horizontal legs from the second side of the I metal 611, the two top flats 611T, and the rectangular metal 612 are shown on the second side of the LED package.

While several embodiments have been described by way of example, it will be apparent to those skilled in the art that various modifications may be made without departing from the spirit of the claimed subject matter. Such modifications are all within the scope of the present disclosure, as defined by the appended claims.

The embodiments of the invention in which an exclusive property or privilege is claimed are defined as follows:

1. A manufacturing process for making a light emitting diode (LED) package having a top surface, an opposing bottom surface, a left surface, and an opposing right surface, wherein the left and the right surfaces extend between the top and bottom surfaces, the manufacturing process comprising:
    mounting an LED on an inner end of a first metal, wherein the LED is electrically coupled to the first metal, and wherein an outer end of the first metal terminates at an outer edge;
    electrically coupling the LED to an inner end of a second metal by a metal wire, wherein an outer end of the second metal terminates at an outer edge;
    bending the outer end of the first metal in a first direction along the left surface of the LED package and along the top surface to form a top electrode of the LED package;
    bending the outer end of the second metal in a second direction opposite of the first direction along the right surface of the LED package and along the bottom surface to form a bottom electrode of the LED package; and
    enclosing the LED and the metal wire in a protection molding,
    wherein said bending the outer end of the first metal places the outer edge of the first metal at the top surface of the LED package, and
    wherein said bending the outer end of the second metal places the outer edge of the second metal at the bottom surface of the LED package.

2. The manufacturing process of claim 1, wherein said bending the outer end of the first metal in a first direction comprises bending the first metal outside of the protection molding to form the top electrode of the LED package, and wherein said bending the outer end of the second metal in a second direction comprises bending the second metal outside of the protection molding to form the bottom electrode of the LED package.

3. The manufacturing process of claim 1, further comprising enclosing the inner end of the first metal and the inner end of the second metal in the protection molding.

4. The manufacturing process of claim 1, further comprising placing the inner end of the first metal and the inner end of the second metal in a coplanar position.

5. A manufacturing process for making a light emitting diode (LED) package, the manufacturing process comprising:
- mounting an LED on an inner end of a first metal, wherein the LED is electrically coupled to the first metal, and wherein an outer end of the first metal terminates at an outer edge;
- electrically coupling the LED to an inner end of a second metal by a metal wire, wherein an outer end of the second metal terminates at an outer edge;
- bending the outer end of the first metal in a first direction and again bending the outer end of a first metal in the first direction at a different location on the first metal to form a top electrode of the LED package;
- bending the outer end of the second metal in a second direction opposite of the first direction and again bending the outer end of the second metal in the second direction at a different location on the second metal to form a bottom electrode of the LED package; and
- enclosing the LED and the metal wire in a protection molding,
- wherein the inner ends of the first metal and the second metal are enclosed in the protection molding, and wherein the outer ends of the first metal and the second metal exit out from the protection molding on opposite surfaces of the LED package.

6. The manufacturing process of claim 5, wherein said bending the outer end of the first metal in a first direction comprises bending the first metal outside of the protection molding and wherein said bending an outer end of the second metal in the second direction comprises bending the second metal outside of the protection molding.

7. The manufacturing process of claim 5, further comprising placing the inner end of the first metal and the inner end of the second metal in a coplanar position.

\* \* \* \* \*

UNITED STATES PATENT AND TRADEMARK OFFICE
CERTIFICATE OF CORRECTION

PATENT NO.        : 8,524,541 B2                                         Page 1 of 1
APPLICATION NO.   : 13/548067
DATED             : September 3, 2013
INVENTOR(S)       : Wu It is certified that error appears in the above-identified patent and that said Letters Patent is hereby corrected as shown below:

On the Title Page, item (52), under "U.S. Cl.", in Column 1, Line 2, delete "438/123" and insert -- 438/123; 438/124 --, therefor.

Figure 2:
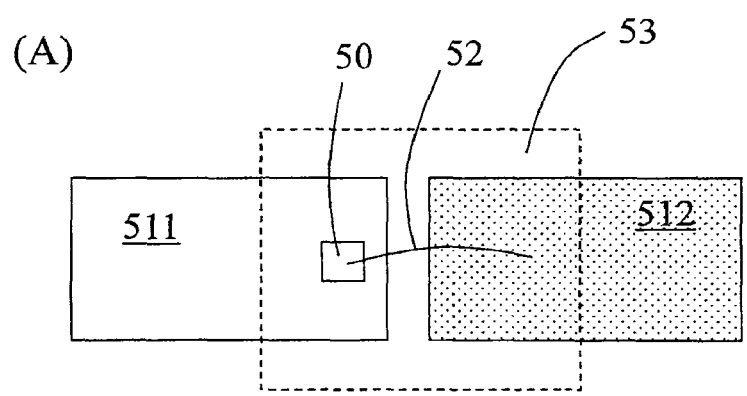
FIGS. 2A, 2B, 3A, and 3B show different views of a first embodiment according to the present disclosure.
Figure 2:
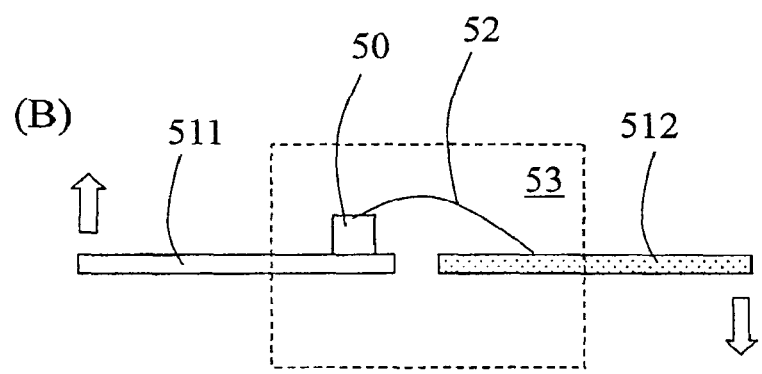

In the Drawings:

In Fig. 2, Sheet 2 of 7, delete "Fig. 2." and insert -- Fig. 2 --, therefor.

Figure 3:
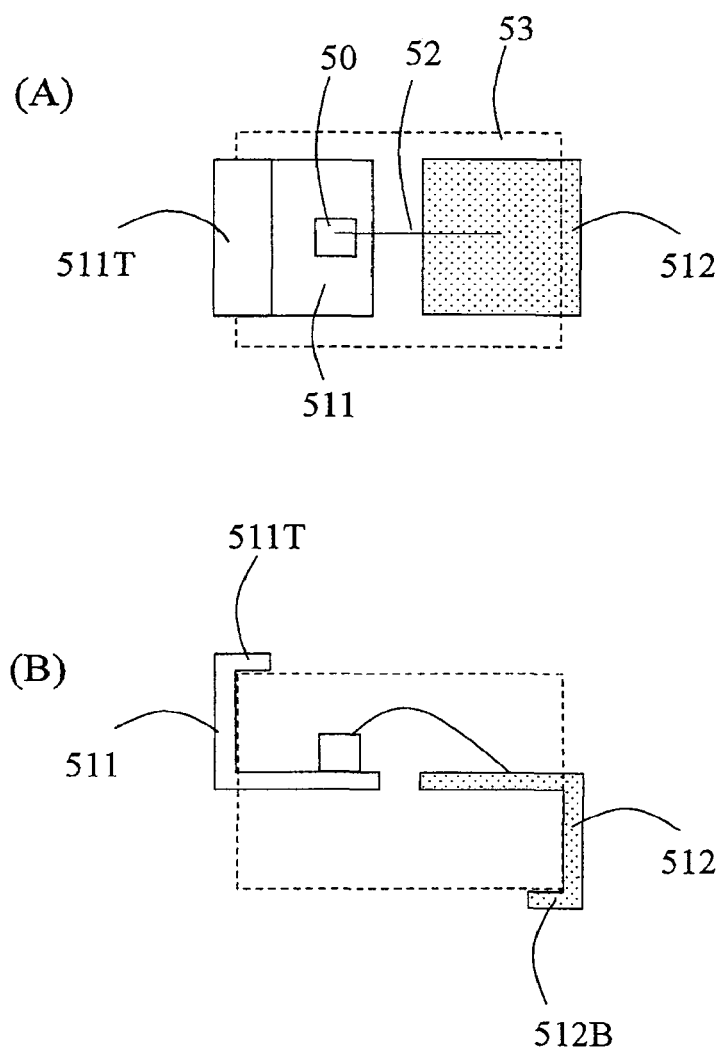

In Fig. 3, Sheet 3 of 7, delete "Fig. 3." and insert -- Fig. 3 --, therefor.

Signed and Sealed this
Twenty-seventh Day of May, 2014

Michelle K. Lee
*Deputy Director of the United States Patent and Trademark Office*